(12) United States Patent
Yoon et al.

(10) Patent No.: US 7,903,067 B2
(45) Date of Patent: Mar. 8, 2011

(54) DRIVER CHIP AND DISPLAY APPARATUS HAVING THE SAME

(75) Inventors: Ju-Young Yoon, Yongin-si (KR);
Chun-Ho Song, Seoul (KR);
Seong-Yong Hwang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 697 days.

(21) Appl. No.: 11/954,772

(22) Filed: Dec. 12, 2007

(65) Prior Publication Data

US 2008/0174535 A1 Jul. 24, 2008

Related U.S. Application Data

(62) Division of application No. 11/012,228, filed on Dec. 16, 2004, now Pat. No. 7,327,411.

(30) Foreign Application Priority Data

Dec. 16, 2003 (KR) .................. 10-2003-0091951

(51) Int. Cl.
*G09G 3/36* (2006.01)
(52) U.S. Cl. .................. 345/90; 345/204; 349/152
(58) Field of Classification Search .......... 345/36, 345/42, 51–53, 55, 76, 78, 80–84, 87, 90, 345/100, 204–206, 214; 349/149–152
See application file for complete search history.

(56) References Cited

U.S. PATENT DOCUMENTS

| | | | |
|---|---|---|---|
| 5,572,346 A * | 11/1996 | Sakamoto et al. ............ 349/150 |
| 5,712,493 A | 1/1998 | Mori et al. | |
| 6,054,975 A | 4/2000 | Kurokawa et al. | |
| 6,172,732 B1 * | 1/2001 | Hayakawa et al. ............ 349/152 |
| 6,956,548 B2 | 10/2005 | Yarita et al. | |
| 7,061,117 B2 * | 6/2006 | Yang et al. ............ 257/773 |
| 7,167,227 B2 | 1/2007 | Aruga et al. | |
| 7,327,411 B2 * | 2/2008 | Yoon et al. ............ 349/33 |
| 7,446,398 B2 * | 11/2008 | Niu et al. ............ 257/668 |
| 7,486,284 B2 * | 2/2009 | Hwang et al. ............ 345/204 |
| 7,557,889 B2 * | 7/2009 | Lin et al. ............ 349/152 |
| 2005/0205888 A1 | 9/2005 | Miyasaka | |

FOREIGN PATENT DOCUMENTS

| | | |
|---|---|---|
| JP | 05-235089 A | 9/1993 |
| JP | 07-086330 A | 3/1995 |
| JP | 10-319419 A | 12/1998 |
| JP | 2002-217237 A | 8/2002 |
| JP | 2003-029659 A | 1/2003 |
| JP | 2003-263117 A | 9/2003 |
| KR | 1020010018964 A | 3/2001 |
| KR | 1020030085366 A | 11/2003 |

\* cited by examiner

*Primary Examiner* — Henry N. Tran
*Assistant Examiner* — Mansour M Said
(74) *Attorney, Agent, or Firm* — Cantor Colburn LLP (57) ABSTRACT

A driver chip includes a base body, input terminals, first output terminals and dummy terminals. The base body includes a face having first to fourth edge portions. The first and second edge portions are disposed in substantially parallel along a longitudinal side of the face, and the third and fourth edge portions are disposed in substantially parallel along a horizontal side of the face. The input terminals are formed on the first edge portion such that the input terminals are arranged along the longitudinal side. The first output terminals are formed on the second edge portion such that the first output terminals are arranged along the longitudinal side. The dummy terminals are formed such that the dummy terminals are disposed between the input terminals and the first output terminals. A warpage and defects of electrical connection between the driver chip and a display panel of the display apparatus are prevented.

8 Claims, 11 Drawing Sheets

DRIVER CHIP AND DISPLAY APPARATUS HAVING THE SAME

CROSS-REFERENCE TO RELATED APPLICATIONS

This application is a divisional application of U.S. application Ser. No. 11/012,228 filed on Dec. 16, 2004, which claims priority to Korean Patent Application No. 2003-91951 filed on Dec. 16, 2003, the contents of which are herein incorporated by reference in its entirety.

BACKGROUND OF THE INVENTION

1. Field of the Invention

The present invention relates to a driver chip and a display apparatus having the driver chip. More particularly, the present invention relates to a driver chip capable of enhancing a reliability of connection between the driver chip and a display panel and a display apparatus having the driver chip.

2. Description of the Related Art

Generally, many electronic devices, for example such as telecommunication terminal, digital camera, notebook computer, monitor, etc., include a display apparatus. The display apparatus has various kinds. However, a flat type display apparatus, especially a liquid crystal display (LCD) apparatus, is widely used.

The LCD apparatus displays an image by using liquid crystal. The LCD apparatus has various characteristics such as lightweight, thin thickness, low power consumption, low driving voltage, etc. Therefore, the LCD apparatus is used in various fields.

A conventional LCD apparatus includes a display panel that displays an image and a driver chip that drives the display panel.

The driver chip converts an image data provided from an external device into an image signal that is adequate to the display panel, and applies the image signal to the display panel at proper time.

The driver chip may be electrically connected to the driver chip in various ways.

Recently, a chip on glass (COG) method is employed in order to reduce manufacturing cost and size. According to the COG method, a driver chip is directly mounted on the display panel. In detail, an anisotropic conductive film (ACF) is interposed between the driver chip and the display panel, and the driver chip is compressed to the display panel and the ACF is heated.

The above mentioned COG method is effective at electrical connection between minute terminals, but the COG method is performed under high temperature. Therefore, the driver chip may be damaged, and the driver chip may also be bent. In detail, when the chip is heated and cooled down, the driver chip is bent due to difference of thermal expansion coefficient between the driver chip and the liquid crystal display panel. Therefore, an electrical connection between the driver chip and the liquid crystal display panel may be damaged.

SUMMARY OF THE INVENTION

The present invention provides a driver chip capable of enhancing a reliability of connection between the driver chip and a display panel.

The present invention also provides a display apparatus having the driver chip.

In an exemplary driver chip according to the present invention, the driver chip includes a base body, a plurality of input terminals, a plurality of first output terminals and a plurality of dummy terminals. The base body includes a face having first, second, third and fourth edge portions. The first and second edge portions are disposed in substantially parallel along a longitudinal side of the face, and the third and fourth edge portions being disposed in substantially parallel along a horizontal side of the face. The horizontal side is in substantially perpendicular to the longitudinal side. The input terminals are formed on the first edge portion such that the input terminals are arranged along the longitudinal side. The first output terminals are formed on the second edge portion such that the first output terminals are arranged along the longitudinal side. The dummy terminals are formed such that the dummy terminals are disposed between the input terminals and the first output terminals.

In another exemplary driver chip according to the present invention, the driver chip includes a base body, a plurality of input terminals, a plurality of first output terminals, a plurality of second output terminals and a plurality of third output terminals. The base body includes a face having first, second, third and fourth edge portions. The first and second edge portions are disposed in substantially parallel along a longitudinal side of the face, and the third and fourth edge portions are disposed in substantially parallel along a horizontal side of the face. The horizontal side is in substantially perpendicular to the longitudinal side. The input terminals are formed on the first edge portion such that the input terminals are arranged along the longitudinal side. The first output terminals are formed on the second edge portion such that the first output terminals are arranged along the longitudinal side. The second output terminals are formed on the third edge portion along the horizontal side. The third output terminals are formed on the fourth edge portion along the horizontal side.

Therefore, a warpage and defects of electrical connection between the driver chip and a display panel of the display apparatus are prevented by forming dummy terminals that are connected to dummy pads along a longitudinal side of the driver chip.

Additionally, the warpage and the defects of electrical connection between the driver chip and the display panel are prevented by shifting terminals that are adjacent to horizontal sides toward a center of the chip by a predetermined amount.

BRIEF DESCRIPTION OF THE DRAWINGS

The above and other features and advantages of the present invention will become more apparent by describing in detailed exemplary embodiments thereof with reference to the accompanying drawings, in which.

DESCRIPTION OF EMBODIMENTS

Hereinafter, the embodiments of the present invention will be described in detail with reference to the accompanied drawings.

Figure 1:
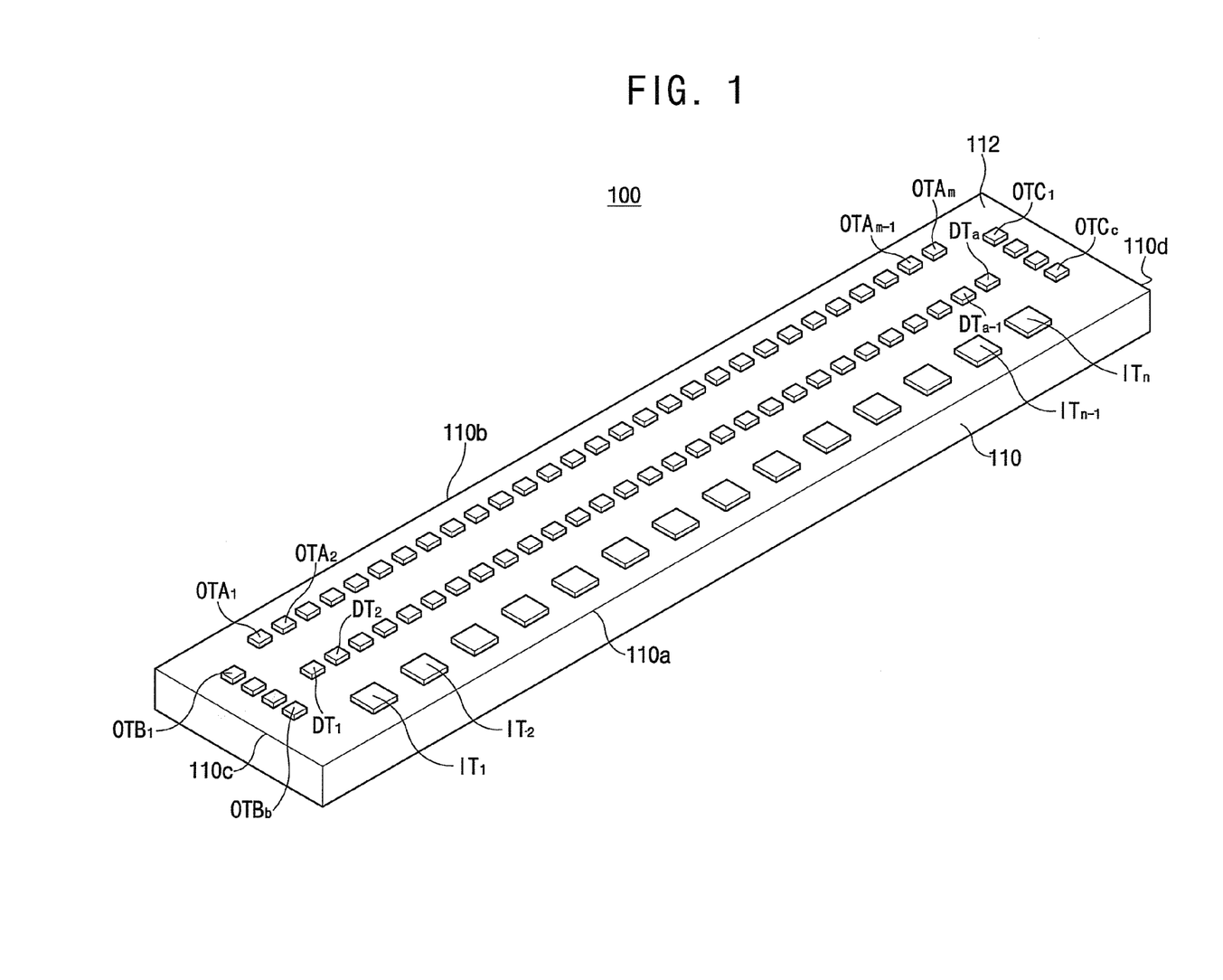
FIG. 1 is a perspective view illustrating a driver chip according to a first exemplary embodiment of the present invention.
Figure 2:
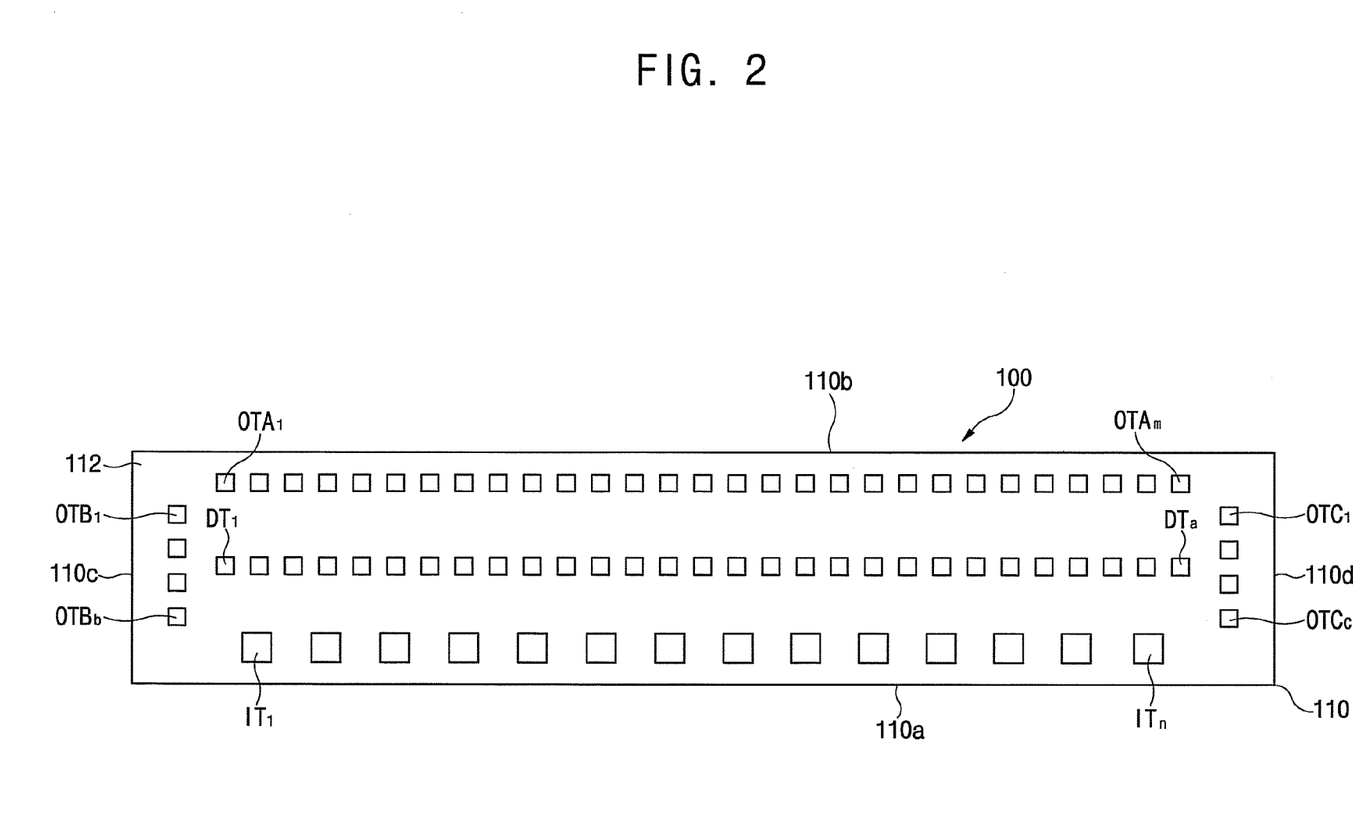
FIG. 2 is a plan view illustrating the driver chip in FIG. 1.

FIG. 1 is a perspective view illustrating a driver chip according to a first exemplary embodiment of the present invention, and FIG. 2 is a plan view illustrating the driver chip in FIG. 1.

Referring to FIGS. 1 and 2, a driver chip 100 according to a first exemplary embodiment of the present invention includes a base body 110, a plurality of input terminals IT1 to ITn, a plurality of first output terminals OTA1 to OTAm and a plurality of dummy terminals DT1 to DTa, wherein 'n', 'm' and 'a' are natural numbers no less than 2.

The base body 110 includes a dielectric material. The base body 110 has a rectangular parallelepiped shape having first and second longitudinal sides 110a and 110b, and first and second horizontal sides 110c and 110d in substantially perpendicular to the first and second longitudinal sides 110a and 110b. A semiconductor device (not shown) that processes an external image data and outputs a driving signal is disposed inside the base body 110.

The input terminals IT1 to ITn are formed on a first surface 110 of the base body 110 such that a top surface of the input terminals IT1 to ITn is higher than the first surface 110. The input terminals IT1 to ITn are arranged at a first edge portion adjacent to the first longitudinal side 110a along the first longitudinal side 110a.

The first output terminals OTA1 to OTAm are formed on the first surface 110 such that a top surface of the first output terminals OTA1 to OTAm has substantially same height as the top surface of the input terminals IT1 to ITn. The first output terminals OTA1 to OTAm are arranged at a second edge portion adjacent to the second longitudinal side 110b along the second longitudinal side 110b. The second edge portion is spaced apart from the first edge portion along the first horizontal side 110c. The first output terminals OTA1 to OTAm may have same size as the input terminals IT1 to ITn. Alternatively, the first output terminals OTA1 to OTAm may have smaller size than that of the input terminals IT1 to ITn.

The dummy terminals DT1 to DTa are formed between the input terminals IT1 to ITn and the first output terminals OTA1 to OTAm. The dummy terminals DT1 to DTa have same height as that of the input terminals IT1 to ITn and the first output terminals OTA1 to OTAm with respect to the first surface 112. The dummy terminals DT1 to DTa are arranged along a line connecting centers of the first and second horizontal sides 110c and 110d along the first and second longitudinal sides 110a and 110b. The dummy terminals DT1 to DTa are not involved in signal transmission. The dummy terminals DT1 to DTa only support the driver chip 100 when the driver chip 100 is combined with the liquid crystal display panel (not shown). The dummy terminals DT1 to DTa may have various shapes. For example, the dummy terminals DT1 to DTa have substantially same shape as that of the first output terminals OTA1 to OTAm.

The driver chip 100 further includes a plurality of second output terminals OTB1 to OTBb and a plurality of third output terminals OTC1 to OTCc, wherein 'b' and 'c' are natural numbers no less than 2.

The second output terminals OTB1 to OTBb are formed on the first surface 112 such that the second output terminals OTB1 to OTBb have same height as that of the first output terminals OTA1 to OTAm with respect to the first surface 112. The second output terminals OTB1 to OTBb are formed at a third edge portion adjacent to the first horizontal side 110c. The second output terminals OTB1 to OTBb are arranged in a line along the first horizontal side 110c.

The third output terminals OTC1 to OTCc are formed on the first surface 112 such that the third output terminals OTC1 to OTCc have same height as that of the first and second output terminals OTA1 to OTAm and OTB1 to OTBb with respect to the first surface 112. The third output terminals OTC1 to OTCc are formed at a fourth edge portion adjacent to the second horizontal side 110d. The fourth edge portion is spaced apart from the third edge portion along the first and second longitudinal sides 110a and 110b. The third output terminals OTC1 to OTCc are arranged in a line along the second horizontal side 110d.

Therefore, the dummy terminals DT1 to DTa are disposed between the second output terminals OTB1 to OTBb and the third output terminals OTC1 to OTCc.

Figure 3:
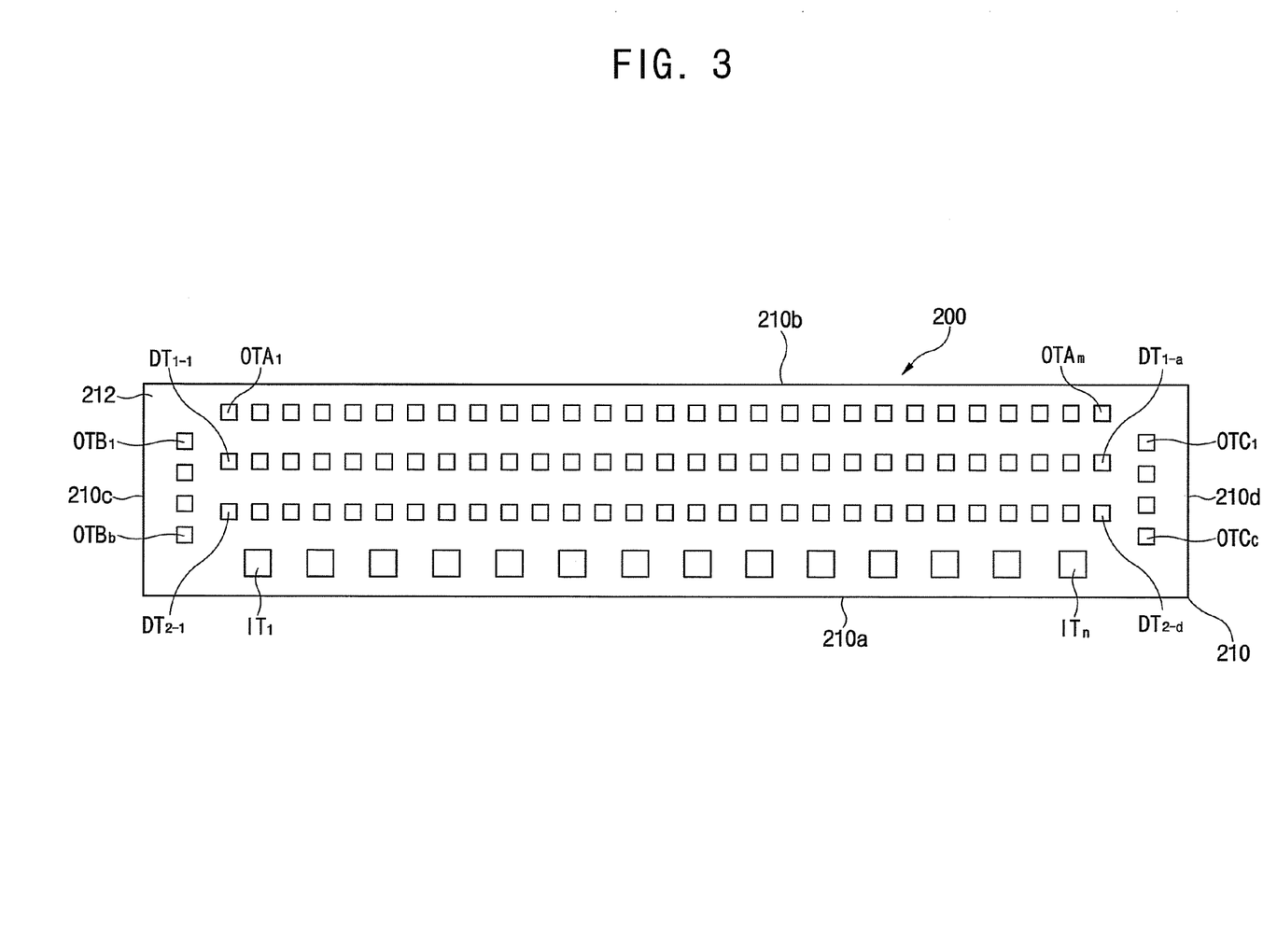
FIG. 3 is a plan view illustrating a driver chip according to a second exemplary embodiment of the present invention.

FIG. 3 is a plan view illustrating a driver chip according to a second exemplary embodiment of the present invention.

Referring to FIG. 3, a driver chip 200 according to a second exemplary embodiment of the present invention includes a base body 210, input terminals IT1 to ITn, first output terminals OTA1 to OTAm, second output terminals OTB1 to OTBb, third output terminals OTC1 to OTc and dummy terminals DT1-1 to DT1-a and DT2-1 to DT2-d. The driver chip 200 according to the present embodiment is substantially same as the driver chip 100 in the first exemplary embodiment except for the dummy terminals DT1-1 to DT1-a and DT2-1 to DT2-d. Therefore, any further explanation will be omitted.

The dummy terminals DT1-1 to DT1-a and DT2-1 to DT2-d are disposed between the input terminals IT1 to ITn and the first output terminals OTA1 to OTAm. The dummy terminals DT1-1 to DT1-a and DT2-1 to DT2-d are also disposed between the second output terminals OTB1 to OTBb and the third output terminals OTC1 to OTCc. The dummy terminals DT1-1 to DT1-a and DT2-1 to DT2-d are arranged in two lines. That is, the dummy terminals DT1-1 to DT1-a form a first line, and the dummy terminals DT2-1 to DT2-d form a second line. The first line of the dummy terminals DT1-1 to DT1-a is adjacent to the first output terminals OTA1 to OTAm. The second line of the dummy terminals DT2-1 to DT2-d is adjacent to the input terminals IT1 to ITn. For example, the first line of the dummy terminals DT1-1 to DT1-a is disposed along a line connecting a one third of a first horizontal side 210c and a second horizontal side 210d along a direction from a second longitudinal side 210b to a first longitudinal side 210a, and the second line of the dummy terminals DT2-1 to DT2-d is disposed along a line connecting a two thirds of a first horizontal side 210c and a second horizontal side 210d along the direction from the second longitudinal side 210b to the first longitudinal side 210a.

In the present embodiment, the dummy terminals DT1-1 to DT1-a and DT2-1 to DT2-d are arranged, for example in two lines. Alternatively, dummy terminals may be arranged in more than two lines.

Figure 4:
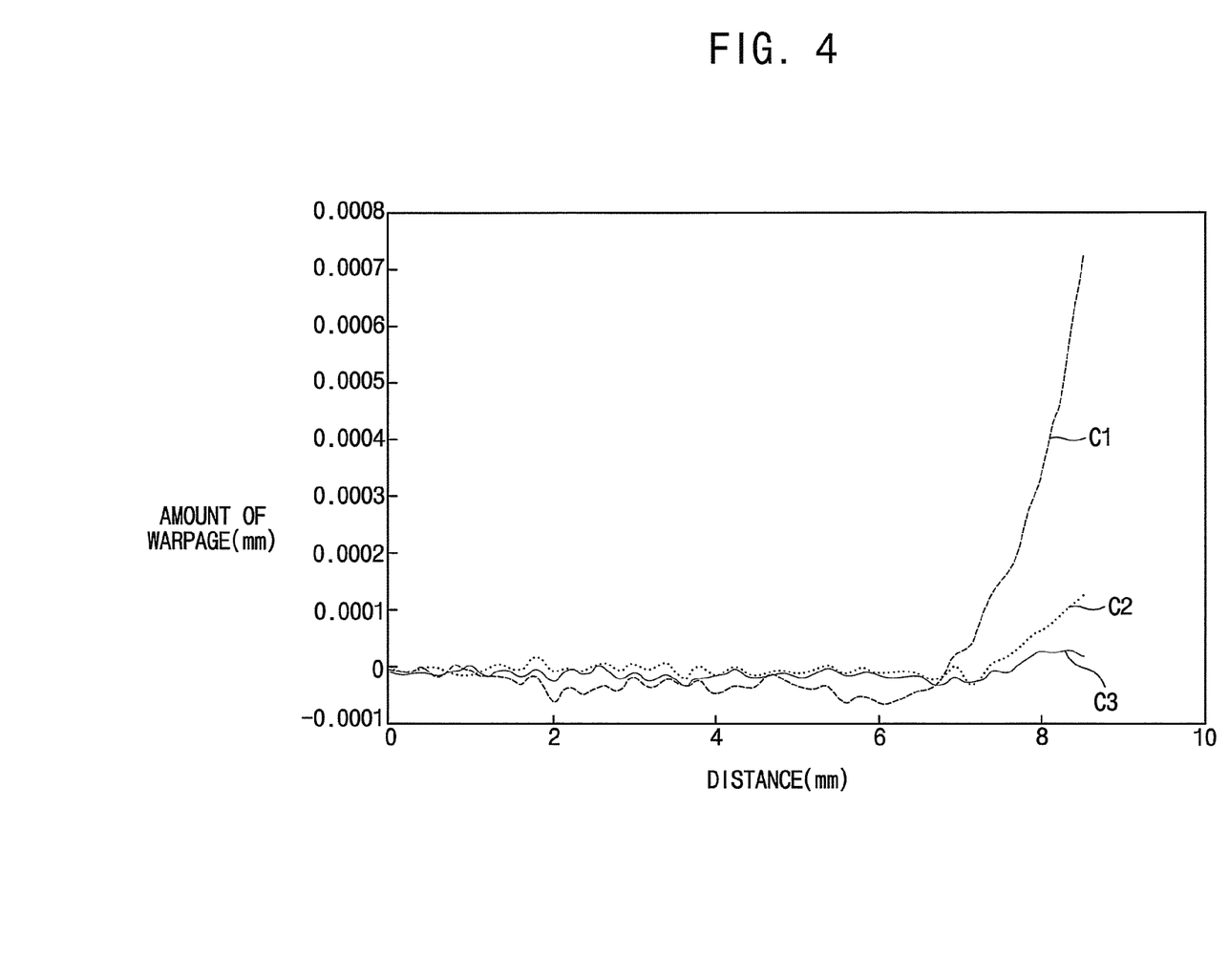
FIG. 4 is a graph showing a relationship between an amount of warpage and a distance.

FIG. 4 is a graph showing a relationship between an amount of warpage and a distance. The graph of FIG. 4 was obtained by using a chip of which a longitudinal side was about 17 mm and a horizontal side was about 3 mm. A length of the horizontal side is preferably no less than 2 mm.

Referring to FIG. 4, a graph C1 corresponds to a driver chip having no dummy terminals. A graph C2 corresponds to a driver chip having one line of dummy terminals. A graph C3 corresponds to a driver chip having two lines of dummy terminals. X-axis represents a distance between a center of the longitudinal side and an end point of the longitudinal side (or horizontal side).

As shown in FIG. 4, an amount of warpage of a central portion was small. However, an amount of warpage of a portion was increased as the portion became farther from the central portion. Especially, an amount of warpage of a portion that was spaced apart from the central portion by about 7 to about 8.5 mm increased abruptly. Therefore, an electrical connection between a driver chip and a display panel was damaged. In detail, an electrical connection between a terminal disposed adjacent to the horizontal sides and the driver chip was heavily damaged.

However, an amount of warpage was decreased as a line of dummy terminals according to the present invention was increased. Therefore, the dummy terminals prevented a damage of electric connection between the driver chip and the display panel.

Figure 5:
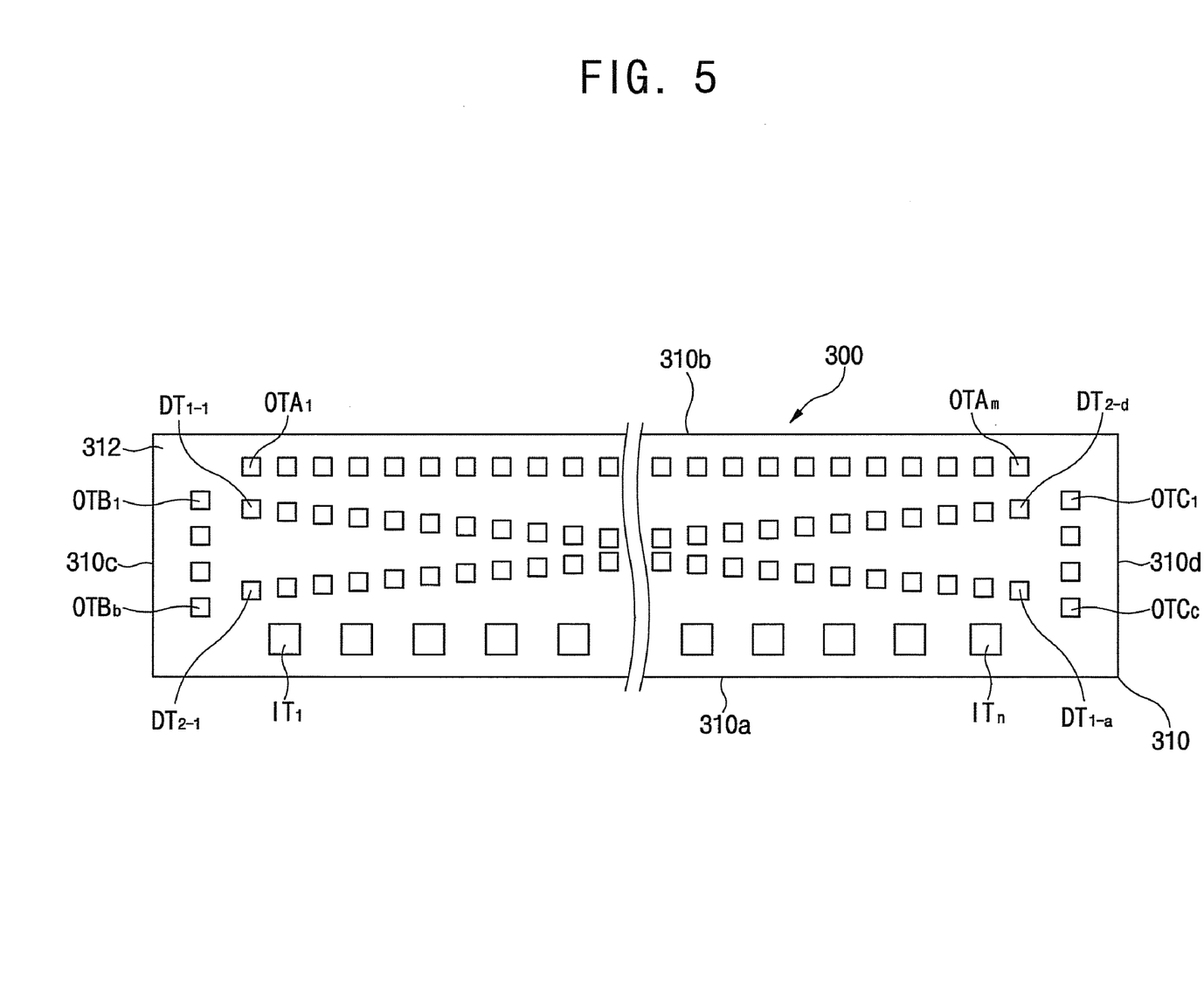
FIG. 5 is a plan view illustrating a driver chip according to a third exemplary embodiment of the present invention.

FIG. 5 is a plan view illustrating a driver chip according to a third exemplary embodiment of the present invention.

Referring to FIG. 5, a driver chip 300 according to a third exemplary embodiment of the present invention includes a base body 310, input terminals IT1 to ITn, first output terminals OTA1 to OTAm, second output terminals OTB1 to OTBb, third output terminals OTC1 to OTCc and dummy terminals DT1-1 to DT1-a and DT2-1 to DT2-d. The driver chip 300 according to the present embodiment is substantially same as the driver chip 100 in the first exemplary embodiment except for the dummy terminals DT1-1 to DT1-a and DT2-1 to DT2-d. Therefore, any further explanation will be omitted.

The dummy terminals DT1-1 to DT1-a and DT2-1 to DT2-d are disposed between the input terminals IT1 to ITn and the first output terminals OTA1 to OTAm. The dummy terminals DT1-1 to DT1-a and DT2-1 to DT2-d are disposed also between the second output terminals OTB1 to OTBb and the third output terminals OTC1 to OTCc. The dummy terminals DT1-1 to DT1-a and DT2-1 to DT2-d are arranged in two lines. That is, the dummy terminals DT1-1 to DT1-a form a first line, and the dummy terminals DT2-1 to DT2-d form a second line. The first line of the dummy terminals DT1-1 to DT1-a crosses the second line of the dummy terminals DT2-1 to DT2-d at a central portion of the driver chip 300 to form an X-shape. For example, the dummy terminals DT1-1 to DT1-a may be arranged in a line from a connection point of a first horizontal side 310c and a second longitudinal side 310b to a connection point of a first longitudinal side 310a and a second horizontal side 310d, and the dummy terminals DT2-1 to DT2-d may be arranged in a line from a connection point of a first longitudinal side 310a and a first horizontal side 310c to a connection point of a second longitudinal side 310b and a second horizontal side 310d. Therefore, the first line of the dummy terminals DT1-1 to DT1-a crosses the second line of the dummy terminals DT2-1 to DT2-d at a central portion.

Figure 6:
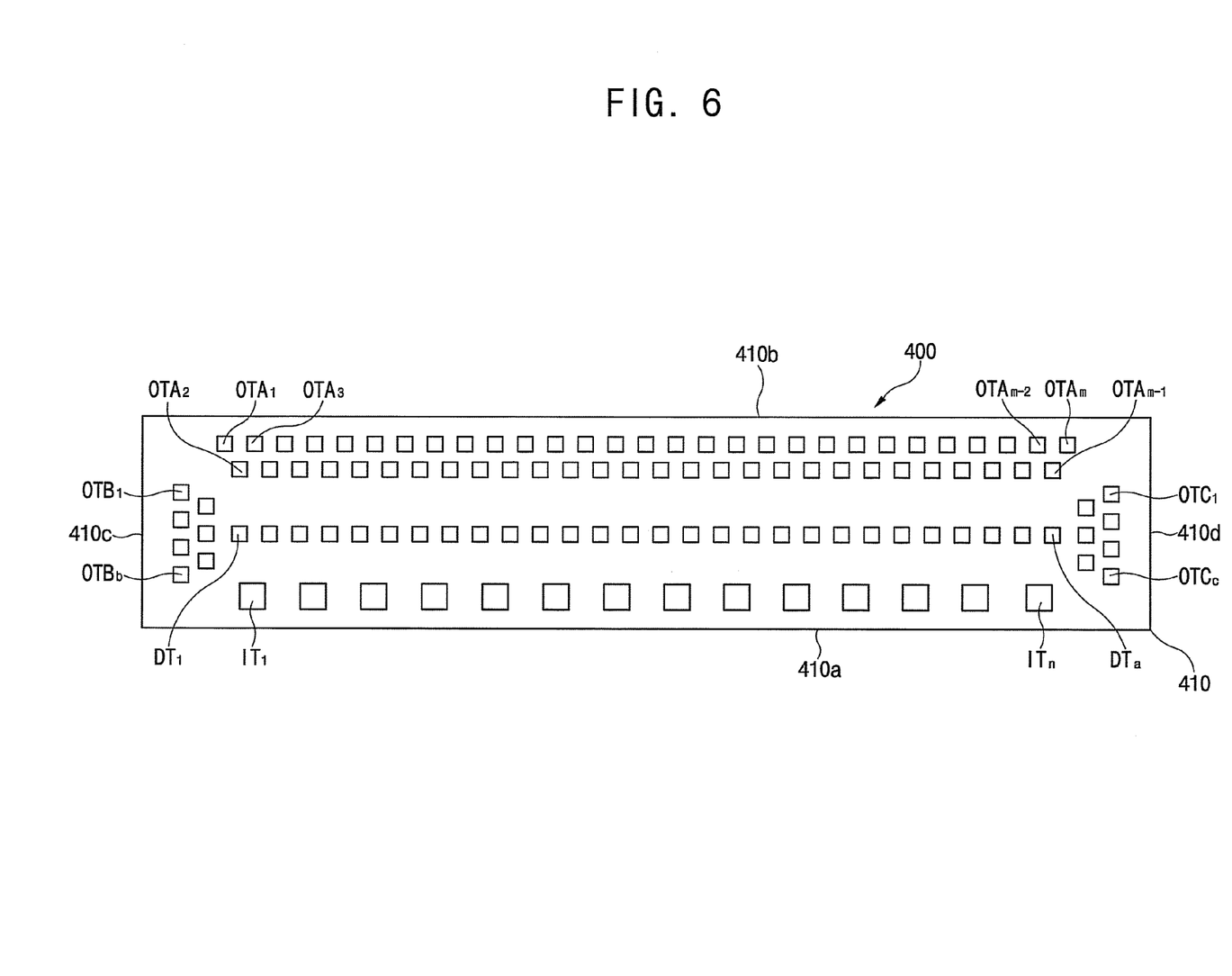
FIG. 6 is a plan view illustrating a driver chip according to a fourth exemplary embodiment of the present invention.

FIG. 6 is a plan view illustrating a driver chip according to a fourth exemplary embodiment of the present invention.

Referring to FIG. 6, a driver chip 400 according to a fourth exemplary embodiment of the present invention includes a base body 410, input terminals IT1 to ITn, first output terminals OTA1 to OTAm, second output terminals OTB1 to OTBb, third output terminals OTC1 to OTCc and dummy terminals DT1 to DTa. The driver chip 400 according to the present embodiment has substantially same input terminals IT1 to ITn and dummy terminals DT1 to DTa as the driver chip 100 of the first exemplary embodiment. Therefore, any further explanation will be omitted.

The first output terminals OTA1 to OTAm are arranged in two lines along a second longitudinal side 410b. In detail, odd numbered output terminals OTA1, OTA3, . . . form a first line, and even numbered output terminals OTA2, OTA4, . . . form a second line. Each of the first and second lines is in substantially parallel with the second longitudinal side 410b. The first line of the odd numbered output terminals OTA1, OTA3, . . . is spaced apart from the second line of the even numbered output terminals OTA2, OTA4, . . . . Each of the even numbered output terminals OTA2, OTA4, . . . is disposed between the odd numbered output terminals OTA1, OTA3, . . . so that the first output terminals OTA1 to OTAm are arranged in a zigzag pattern. For example, the second terminal OTA2 is disposed between the first and third terminals OTA1 and OTA3, and the fourth terminal OTA4 is disposed between the third and fifth terminals OTA3 and OTA5.

Alternatively, each of the even numbered output terminals OTA2, OTA4, . . . is disposed adjacent to each of the odd numbered output terminals OTA1, OTA3, . . . .

The second output terminals OTB1 to OTBb are arranged in two lines along a first horizontal side 410c. Each of the two lines of the second output terminals OTB1 to OTBb is in substantially parallel with the first horizontal side 410c.

The third output terminals OTC1 to OTCc are arranged in two lines along a second horizontal side 410d. Each of the two lines of the third output terminals OTC1 to OTCc is in substantially parallel with the second horizontal side 410d.

The first, second and third output terminals OTA1 to OTAm, OTB1 to OTBb and OTC1 to OTCc may be disposed in more than two lines.

Hereinbefore, embodiments of driver chip that prevents warpage by using dummy terminals are explained. Hereinafter, embodiment of driver chip that prevents warpage without the dummy terminals will be explained.

Figure 7:
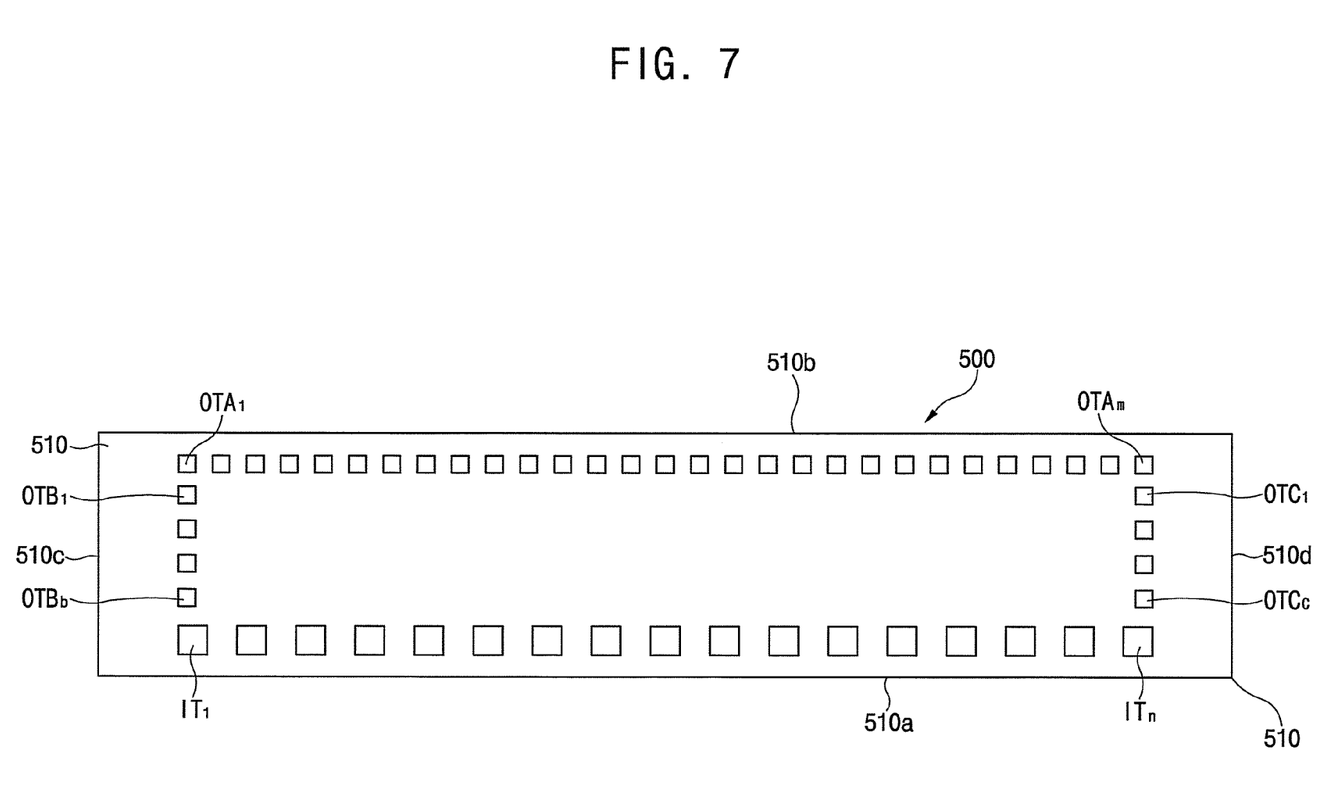
FIG. 7 is a plan view illustrating a driver chip according to a fifth exemplary embodiment of the present invention.

FIG. 7 is a plan view illustrating a driver chip according to a fifth exemplary embodiment of the present invention.

Referring to FIG. 7, a driver chip 500 according to a fifth exemplary embodiment of the present invention includes a base body 510, input terminals IT1 to ITn, first output terminals OTA1 to OTAm, second output terminals OTB1 to OTBb and third output terminals OTC1 to OTCc. The driver chip 500 according to the present embodiment has substantially same input terminals IT1 to ITn and dummy terminals DT1 to DTa as the driver chip 100 of the first exemplary embodiment. Therefore, any further explanation will be omitted.

The second output terminals OTB1 to OTBb are formed at a third edge portion adjacent to a first horizontal side 510c. The second output terminals OTB1 to OTBb are arranged in a line along the first horizontal side 510c. The second output terminals OTB1 to OTBb are spaced apart from the first horizontal side 510c by a predetermined distance. The second output terminals OTB1 to OTBb are disposed between the input terminals IT1 to ITn and the first output terminals OTA1 to OTAm.

The third output terminals OTC1 to OTCc are formed at a fourth edge portion adjacent to a second horizontal side 510d. The third output terminals OTC1 to OTCc are arranged in a line along the second horizontal side 510d. The third output terminals OTC1 to OTc are spaced apart from the second horizontal side 510d by a predetermined distance. The third output terminals OTC1 to OTCc are disposed between the input terminals IT1 to ITn and the first output terminals OTA1 to OTAm.

The second and third output terminals OTB1 to OTBb and OTC1 to OTCc are spaced apart from the first and second horizontal sides 510a and 510b by more than about 200 µm, respectively.

Figure 8:
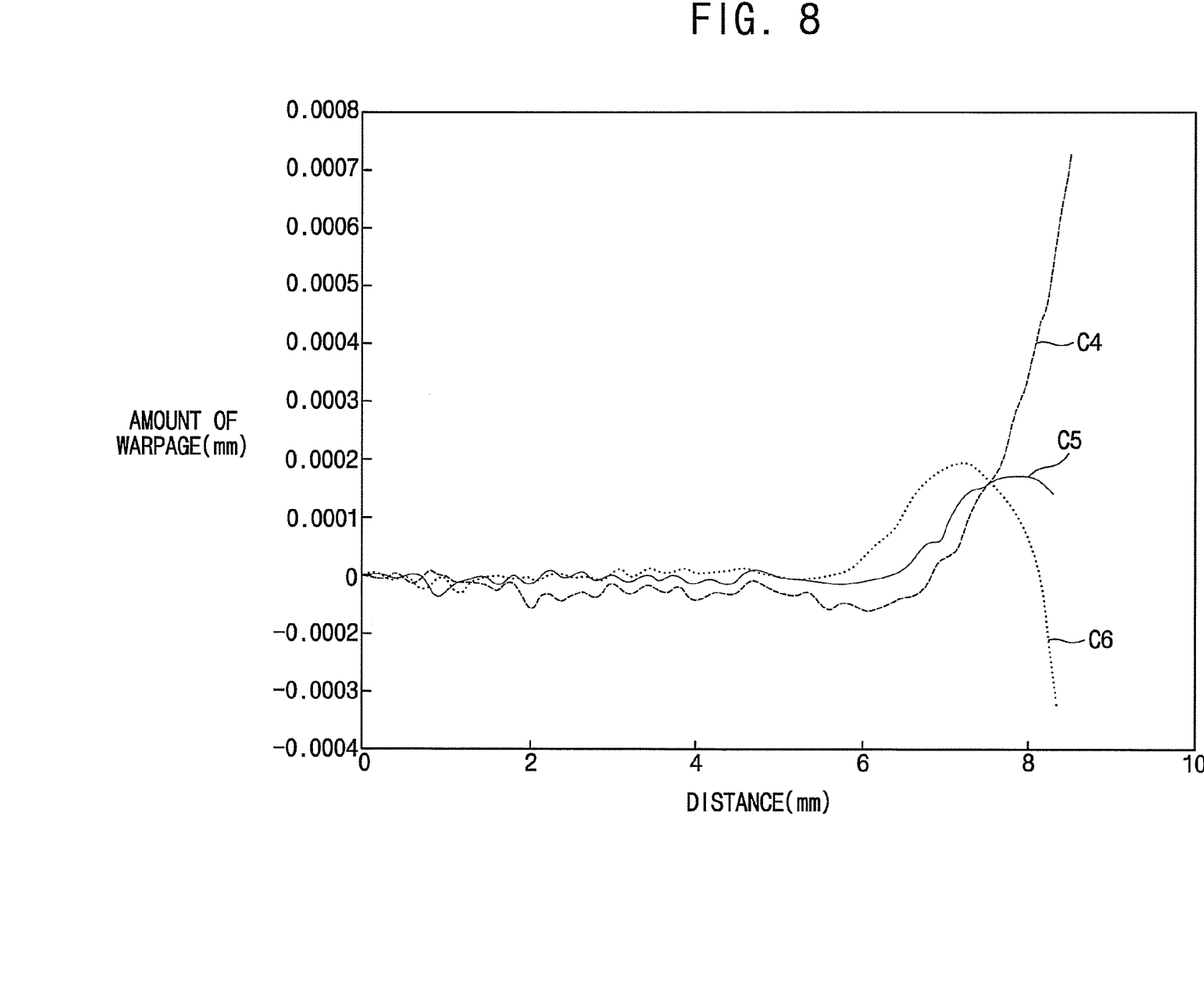
FIG. 8 is a graph showing an amount of warpage according to a position of second and third output terminals in FIG. 7.

FIG. 8 is a graph showing an amount of warpage according to a position of second and third output terminals in FIG. 7. A graph in FIG. 8 was obtained by using the driver chip 600 in FIG. 7 of which first and second longitudinal sides had a length of about 17 mm and first and second sides had a length of about 3 mm.

Referring to FIG. 8, a graph C4 corresponds to the driver chip 500 having the second output terminals OTB1 to OTBb spaced apart from the first horizontal side 510c by about 70 µm. A graph C5 corresponds to the driver chip 500 having the second output terminals OTB1 to OTBb spaced apart from the first horizontal side 510c by about 500 µm. A graph C6 corresponds to the driver chip having the second output terminals OTB1 to OTBb spaced apart from the first horizontal side 510c by about 1 mm. X-axis represents a distance from a central portion of the driver chip 500 toward the first horizontal side 510c.

In case of the driver chip 500 of which second output terminals OTB1 to OTBb spaced apart from the first horizontal side 510c by about 70 µm, an amount of warpage of a central portion was small according to the graph C4. However, an amount of warpage of a portion that was spaced apart from the central portion by about 7 to 8.5 mm was increased abruptly.

In case of the driver chip 500 of which second output terminals OTB1 to OTBb spaced apart from the first horizontal side 510c by about 500 µm, an amount of warpage of a central portion was small according to the graph C5. However, an amount of warpage of a portion that was spaced apart from the central portion by about 7 to about 8.5 mm was increased gradually, which was within a range of permission. That is, the amount of warpage resulted no damage at the connection between the driver chip 500 and the display panel.

In case of the driver chip 500 of which second output terminals OTB1 to OTBb spaced apart from the first horizontal side 510c by about 1 mm, an amount of warpage of a central portion was small according to the graph C6. However, an amount of warpage of a portion that was spaced apart from the central portion by about 6 to about 7.5 mm was increased gradually. When a region was spaced apart from the central portion of the driver chip 500 by about 7.5 mm to about 8.5 mm, the amount of warpage was decreased downwardly to be minus warpage. The minus warpage had opposite bending direction to plus warpage. Therefore, the driver chip 500 was tighter than before due a downward warpage (or minus warpage).

As described above, a damage of electric connection between the driver chip and the display panel was prevented by shifting the second and third output terminals OTB1 to OTBb and OTC1 to OTCc by a predetermined amount.

Hereinbefore, various embodiments of a driver chip are explained. Hereinafter, a display apparatus having one of the driver chips will be explained.

Figure 9:
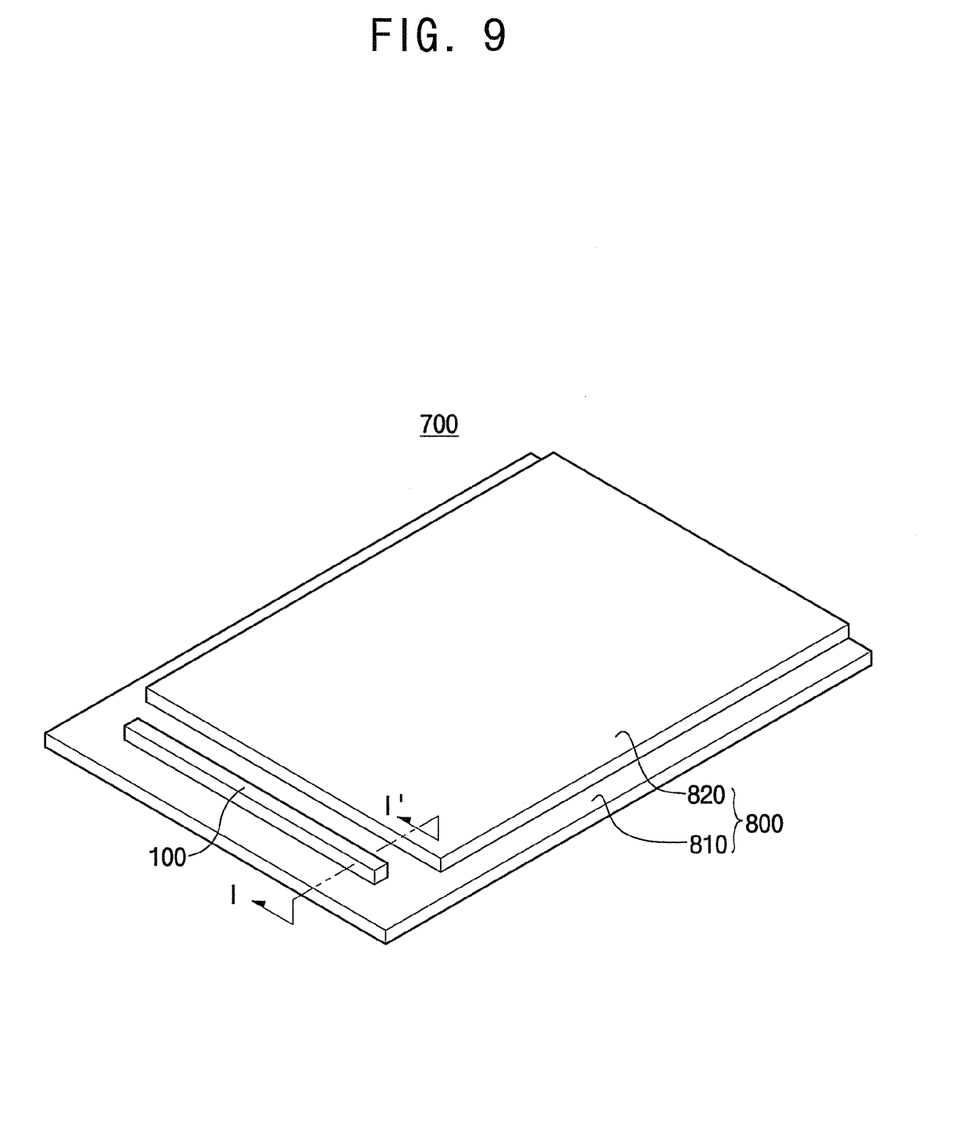
FIG. 9 is a perspective view illustrating a display apparatus according to a sixth exemplary embodiment of the present invention.
Figure 10:
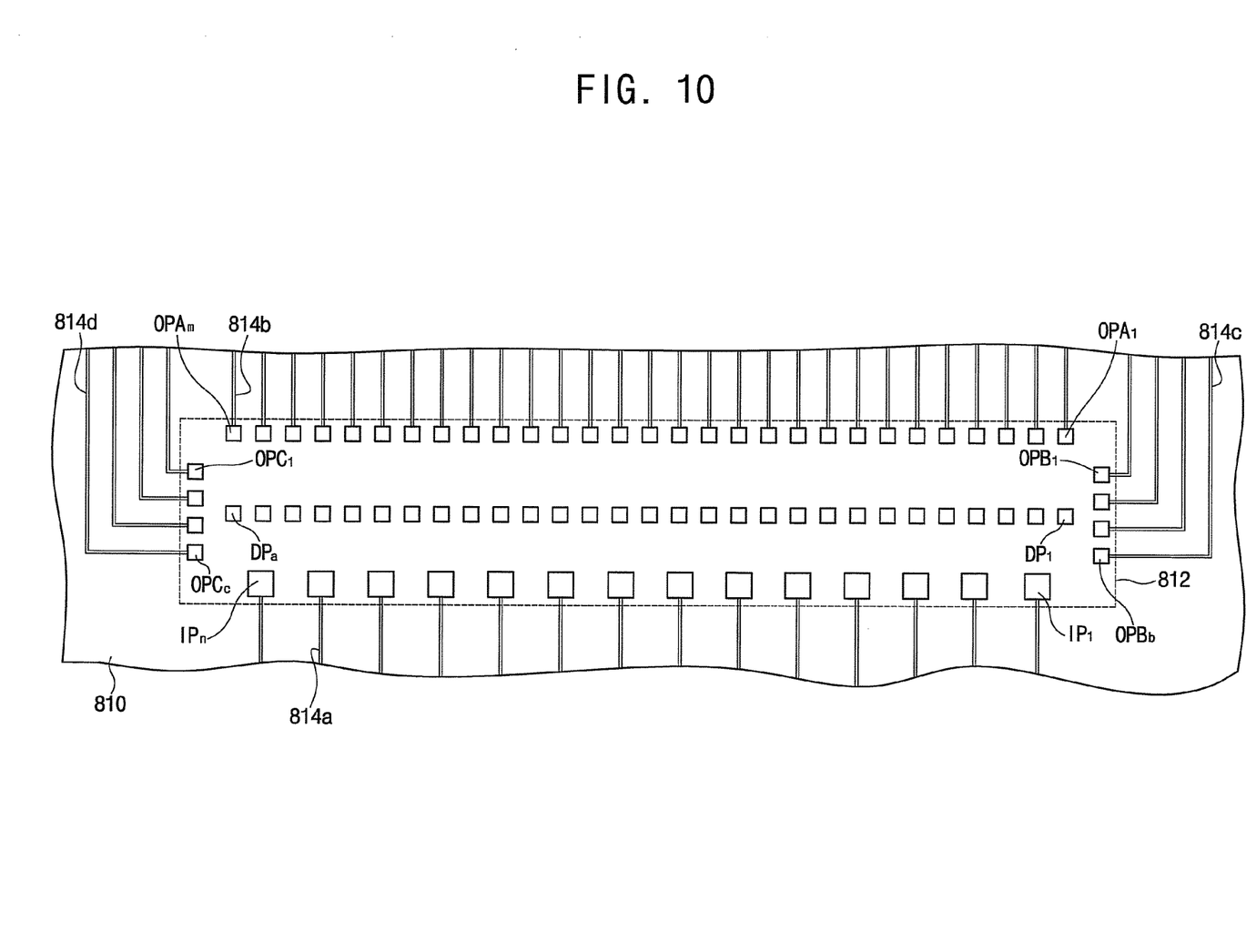
FIG. 10 is a partially enlarged view of pad part of a first substrate in FIG. 9.

FIG. 9 is a perspective view illustrating a display apparatus according to a sixth exemplary embodiment of the present invention, and FIG. 10 is a partially enlarged view of pad part of a first substrate in FIG. 9.

Referring to FIGS. 9 and 10, a display apparatus 700 according to a sixth exemplary embodiment of the present invention includes a driver chip 100 and a display panel 800. The driver chip 100 is explained in FIGS. 1 and 2. Therefore, any further explanation will be omitted. The driver chip 100 may be replaced by one of other embodiments. In that case, a shape of a pad part also changes according to the driver chip.

The display panel 800 includes a first substrate 810, a second substrate 820 and a liquid crystal layer (not shown). The first and second substrates 810 and 820 face with each other. The liquid crystal layer is interposed between the first and second substrates 810 and 820.

The first substrate 810 includes a pad part 812 for electrically connecting with the driver chip 100, and a plurality of conducting lines 814a, 814b, 814c and 814d.

The pad part 812 includes input pads IP1 to IPn, first output pads OPA1 to OPAm, second output pads OPB1 to OPBb, third output pads OPC1 to OPCc and dummy pads DP1 to DPa.

The input pads IP1 to IPn are formed on the first substrate 810, and arranged in a line. The input pads IP1 to IPn are electrically connected to input lines 814a of the conducting lines 814a, 814b, 814c and 814d. The input pads IP1 to IPn correspond to the input terminals IT1 to ITn of the driver chip 100 in one-to-one correspondence, so that input signals provided from an external device are applied to the input terminal IT1 to ITn of the driver chip 100 through the input pads IP1 to IPn.

The first output pads OPA1 to OPAm are arranged in a line such that the first output pads OPA1 to OPAm are spaced apart from the input pads IP1 to IPn. The first output pads OPA1 to OPAm are electrically connected to first output lines 814b of the conducting lines 814a, 814b, 814c and 814d. The first output pads OPA1 to OPAm correspond to the first output terminals OTA1 to OTAm of the driver chip 100 in one-to-one correspondence, so that output signals generated from the driver chip 100 are applied to the first output pads OPA1 to OPAm of the first substrate 810 through the first output terminals OTA1 to OTAm.

The second output pads OPB1 to OPBb are arranged in a line such that a line of the second output pads OPB1 to OPBb is in substantially perpendicular to a line of the first output pads OPA1 to OPAm. The second output pads OPB1 to OPBb are electrically connected to second output lines 814c of the conducting lines 814a, 814b, 814c and 814d. The second output pads OPB1 to OPBb correspond to the second output terminals OTB1 to OTBb of the driver chip 100 in one-to-one correspondence.

The third output pads OPC1 to OPCc are arranged in a line such that a line of the third output pads OPC1 to OPCc is in substantially perpendicular to a line of the first output pads OPA1 to OPAm. The third output pads OPC1 to OPCc are electrically connected to second output lines 814d of the conducting lines 814a, 814b, 814c and 814d. The third output pads OPC1 to OPCc correspond to the third output terminals OTC1 to OTCc of the driver chip 100 in one-to-one correspondence.

The dummy pads DP1 to DPa are arranged in a line between the input pads IP1 to IPn and the first output pads OPA1 to OPAm. The dummy pads DP1 to DPa correspond to the dummy terminals DT1 to DTa of the driver chip 100 in one-to-one correspondence. No conducting line is electrically connected to the dummy pads DP1 to DPa.

The input lines 814a are electrically connected to a flexible printed circuit (FPC, not shown). Therefore, the input signal provided from an external device is applied to the input lines 814a through the FPC.

The first, second and third output lines 814b, 814c and 814d are electrically connected to gate lines (not shown) extended in a first direction on the first substrate 810 and to data lines (not shown) extended in a second direction that is in substantially perpendicular to the first direction on the first substrate 810.

The driver chip 100 is electrically connected to the first substrate 810 through the pad part 812.

Figure 11:
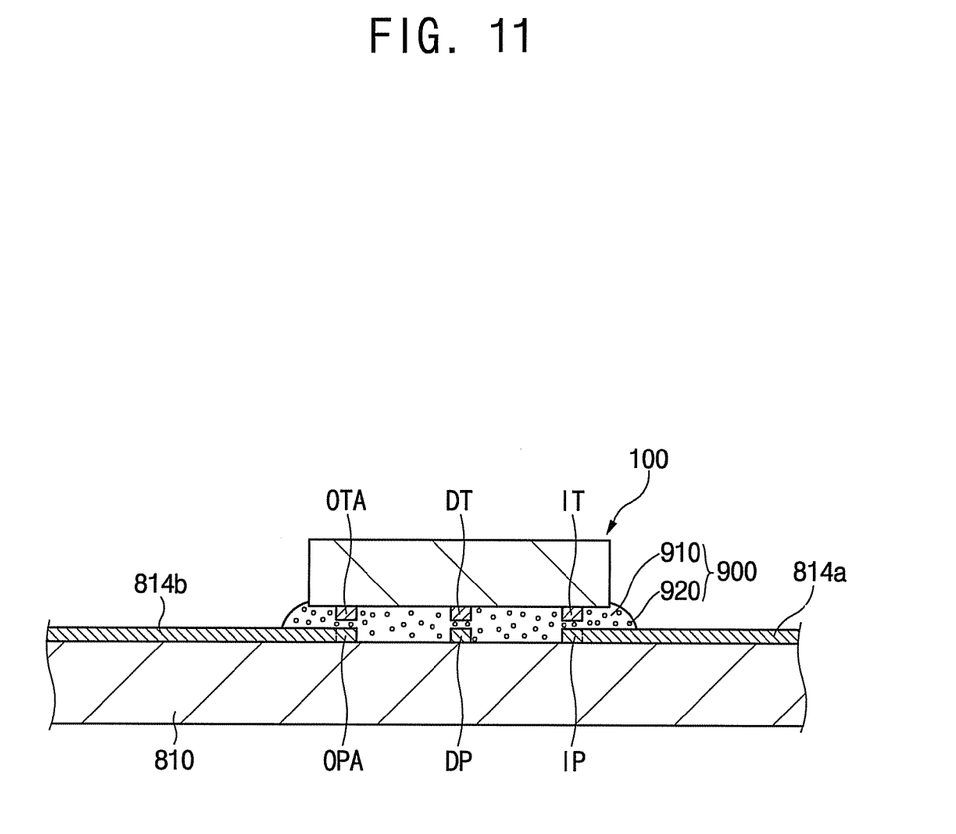
FIG. 11 is a cross-sectional view taken along a line I-I' in FIG. 9.

FIG. 11 is a cross-sectional view taken along a line I-I' in FIG. 9.

Referring to FIG. 11, the driver chip 100 is mounted on the pad part 812 of the first substrate 810 through a chip on glass (COG) process. That is, anisotropic conductive film (ACF) 900 is interposed between the driver chip 100 and the pad part 812, and the driver chip 100 is compressed to the pad part 812, and the ACF 900 is heated.

The ACF 900 includes an adhesive resin 910 and a plurality of electrically conductive particles 920 distributed in the adhesive region 910.

The electrically conductive particles 920 have a small spherical shape. When the ACF 900 is compressed, the electrically conductive particles 920 electrically connect the input terminals IT1 to ITn with the input pads IP1 to IPn, the first output terminals OTA1 to OTAm with the first output pads OPA1 to OPAm and the dummy terminals DT1 to DTa with the dummy pads DP1 to DPa.

The adhesive region 910 includes a thermo-setting material. Therefore, the adhesive region 910 is hardened to fix the driver chip 100 to the first substrate 810.

Although not shown in FIG. 11, the second and third output terminals OTB1 to OTBb and OTC1 to OTCc are electrically connected to the second and third output pads OPB1 to OPBb and OPC1 to OPCc, respectively, by the electrically conductive particles 920.

Hereinbefore, a liquid crystal display panel is explained as an example of the display panel 800. Alternatively, the display panel 800 may be a plasma display (PDP) panel, an organic light emitting display (OLED) panel, etc.

According to the driver chip and the display apparatus having the driver chip of the present invention, a warpage and defects of electrical connection between the driver chip and a display panel of the display apparatus are prevented by forming dummy terminals that are connected to dummy pads along a longitudinal side of the driver chip.

Additionally, the warpage and defects of electrical connection between the driver chip and the display panel are prevented by shifting terminals that are adjacent to horizontal sides toward a center of the chip by a specific amount.

Having described the exemplary embodiments of the present invention and its advantages, it is noted that various changes, substitutions and alterations can be made herein without departing from the spirit and scope of the invention as defined by appended claims.

What is claimed is:

1. A display apparatus comprising:
   a driver chip including:
      a base body including a face having first, second, third and fourth edge portions, the first and second edge portions being disposed in substantially parallel along a longitudinal side of the face, and the third and fourth edge portions being disposed in substantially parallel along a horizontal side of the face, which is in substantially perpendicular to the longitudinal side;
      a plurality of input terminals formed on the first edge portion such that the input terminals are arranged along the longitudinal side;
      a plurality of first output terminals formed on the second edge portion such that the first output terminals are arranged along the longitudinal side; and
      a plurality of dummy terminals formed such that the dummy terminals are disposed between the input terminals and the first output terminals; and
   a display panel including a pad part electrically connected to the driver chip and a plurality of conducting lines electrically connected to the pad part.

2. The display apparatus of claim 1, wherein the dummy terminals are arranged along the longitudinal side.

3. The display apparatus of claim 1, wherein the dummy terminals are arranged in equal to or more than two lines along the longitudinal side.

4. The display apparatus of claim 1, wherein the driver chip further comprises:
   a plurality of second output terminals formed on the third edge portion along the horizontal side; and
   a plurality of third output terminals formed on the fourth edge portion along the horizontal side.

5. The display apparatus of claim 1, wherein the pad part comprises:
   input pads electrically connected to the input terminals in one-to-one correspondence; and
   first output pads electrically connected to the first output terminals in one-to-one correspondence.

6. The display apparatus of claim 5, wherein the pad part further comprises dummy pads electrically connected to the dummy terminals in one-to-one correspondence.

7. The display apparatus of claim 1, wherein the driver chip is electrically connected to the display panel through an anisotropic conductive film.

8. The display apparatus of claim 1, wherein the display panel corresponds to a liquid crystal display panel that displays an image by liquid crystal.

* * * * *